United States Patent
Lee et al.

(10) Patent No.: US 6,943,081 B2
(45) Date of Patent: Sep. 13, 2005

(54) METHOD OF FORMING STORAGE NODES COMPRISING A BASE IN A CONTACT HOLE AND RELATED STRUCTURES

(75) Inventors: Won-Jun Lee, Seoul (KR); In-Seak Hwang, Gyeonggi-do (KR); Ji-Chul Shin, Gyeonggi-do (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 10/445,426

(22) Filed: May 27, 2003

(65) Prior Publication Data

US 2003/0227045 A1 Dec. 11, 2003

(30) Foreign Application Priority Data

May 28, 2002 (KR) ................................ 10-2002-0029494

(51) Int. Cl.[7] .......................................... H01L 21/8242
(52) U.S. Cl. ........................ 438/256; 438/399; 438/239
(58) Field of Search ............................... 438/239, 253, 438/254, 256, 396, 399

(56) References Cited

U.S. PATENT DOCUMENTS

2002/0024085 A1 * 2/2002 Nakamura et al. .......... 257/306

FOREIGN PATENT DOCUMENTS

| JP | 2001-244429 | 9/2001 |
| KR | 1020020001999 A | 1/2002 |
| KR | 2003-0001917 | 1/2003 |
| KR | 10-2003-0001917 | 1/2003 |

OTHER PUBLICATIONS

Notice to Submit Response, Korean Application No. 10–2002–0029494, Jan. 21, 2005.
English Translation of Korean Office Action for Application No. 10/2002–0029494 dated May 28, 2004.

* cited by examiner

*Primary Examiner*—Jack Chen
(74) *Attorney, Agent, or Firm*—Myers Bigel Sibley & Sajovec

(57) ABSTRACT

Methods of forming an electronic structure can include forming an interlayer insulating layer on a substrate, and forming a storage node comprising a base and sidewalls extending away from the base. The interlayer insulating layer can have a contact hole therein exposing a portion of the substrate. Moreover, the storage node base can be in the contact hole and the sidewalls can extend away from the base and away from the substrate with portions of the sidewalls being within the contact hole and with portions of the sidewalls extending outside the contact hole beyond the interlayer insulating layer away from the substrate. Related structures are also discussed.

5 Claims, 15 Drawing Sheets

METHOD OF FORMING STORAGE NODES COMPRISING A BASE IN A CONTACT HOLE AND RELATED STRUCTURES

RELATED APPLICATIONS

This application claims priority from Korean Patent Application No. 2002-29494 filed May 28, 2002 in the Korean Intellectual Property Office, the disclosure of which is incorporated herein in its entirety by reference.

BACKGROUND OF THE INVENTION

1. Field of the Invention

The present invention relates to methods of forming electronic devices, and more particularly, to methods of forming storage nodes for capacitors and related structures.

2. Discussion of the Related Art

With increasing demands for higher-capacity and lower-power dynamic random access memories (DRAMs), methods have been proposed for increasing capacitance of memory cell capacitors while decreasing design rules. The capacitance of the capacitor is proportional to a facing area (hereinafter, referred to as a capacitor area) between an upper electrode (a plate electrode) and a lower electrode (a storage node) and a dielectric constant of a dielectric layer of the capacitor. The capacitance of the capacitor is inversely proportional to a thickness of the dielectric layer. Various kinds of storage nodes have been proposed to increase the capacitor area. Typically, the storage node can be formed in a cylindrical shape, and a height of the storage node can be increased to increase the capacitance of the capacitor.

FIG. 1 is a cross-sectional view illustrating conventional storage nodes. Referring to FIG. 1, an interlayer insulating layer 12 is formed on a semiconductor substrate 10, and storage node plugs 16 passing through the interlayer insulating layer 12 are connected with the semiconductor substrate 10. The storage node plugs 16 are electrically connected with active areas of respective transistors. An etch stop layer 14 remains on the interlayer insulating layer 12. The etch stop layer 14 is formed to reduce etching of the interlayer insulating layer 12 when forming the storage nodes. Respective storage nodes 4 are connected with the corresponding storage node plugs 16. The storage nodes 4 are typically formed in a cylindrical shape to increase the capacitor area. However, when forming high storage nodes, the storage nodes may be tilted. Accordingly, undesired contact may occur between adjacent storage nodes. In addition, planarization and interconnection processes may be difficult to perform.

SUMMARY OF THE INVENTION

According to embodiments of the present invention, methods of forming an electronic structure can include forming an interlayer insulating layer on the substrate and forming a storage node comprising a base and sidewalls extending away from the base. The interlayer insulating layer can have a contact hole therein exposing a portion of the substrate. In addition, the storage node base can be in the contact hole and the sidewalls can extend away from the base and away from the substrate with portions of the sidewalls being within the contact hole and with portions of the sidewalls extending outside the contact hole beyond the interlayer insulating layer away from the substrate.

In addition, forming the storage node can be preceded by forming a storage node plug in the contact hole between the base of the storage node and the exposed portion of the substrate. Moreover, forming the storage node may include forming a mold layer on the interlayer insulating layer wherein the mold layer has a storage node hole therein exposing the storage node plug, removing at least a portion of the storage node plug exposed by the storage node hole, forming the storage node with the base in the contact hole and with the sidewalls along exposed portions of the contact hole and along sidewalls of the storage node hole, and removing the mold layer. Removing at least a portion of the storage node plug can include removing all of the storage node plug from the contact hole. In an alternative, removing at least a portion of the storage node plug may include maintaining a portion of the storage node plug in the contact hole.

According to another alternative, forming a storage node plug may include forming an etch stop layer on surfaces of the interlayer insulating layer opposite the substrate, on sidewalls of the contact hole, and on the exposed portion of the substrate, forming a conductive layer on the etch stop layer filling a remaining portion of the contact hole, and removing portions of the conductive layer above the etch stop layer thereby exposing portions of the etch stop layer on the surface of the interlayer insulating layer opposite the substrate while maintaining portions of the conductive layer in the contact hole. In addition, forming the storage node can be preceded by removing the storage node plug from the contact hole, and removing portions of the etch stop layer on the substrate thereby exposing at least a portion of the substrate through the contact hole. The storage node plug may include a conductive material such as tungsten, titanium, titanium nitride, and/or alloys thereof. The base of the storage node can be directly on the exposed portion of the substrate.

Forming the electronic structure may also include forming an insulating sidewall layer on sidewalls of the contact hole between the storage node and the interlayer insulating layer wherein the insulating sidewall layer and the interlayer insulating layer comprise different materials. Moreover, the insulating sidewall layer may include silicon nitride. Forming the electronic structure may further include forming an insulating surface layer on a surface of the interlayer insulating layer opposite the substrate wherein the insulating surface layer and the interlayer insulating layer comprise different materials. More particularly, the insulating surface layer may include silicon nitride.

The interlayer insulating layer may comprise silicon oxide, the storage node may include a conductive material, and the storage node may include doped polysilicon. Forming the electronic device may also include forming a dielectric layer on exposed surface portions of the storage node, and forming a conductive layer on the dielectric layer opposite the storage node. Moreover, the portion of the substrate exposed by the interlayer insulating layer may comprise a transistor source/drain region.

According to additional embodiments of the present invention, an electronic structure may include a substrate, an interlayer insulating layer on the substrate, and a storage node including a base and sidewalls extending away from the base. The interlayer insulating layer can have a contact hole therein exposing a portion of the substrate. The storage node base can be in the contact hole and the sidewalls can extend away from the base and away from the substrate with portions of the sidewalls being within the contact hole and with portions of the sidewalls extending outside the contact hole beyond the interlayer insulating layer away from the substrate.

The electronic structure may also include a storage node plug in the contact hole between the base of the storage node and the exposed portion of the substrate, and the storage node plug may comprise a conductive material such as tungsten, titanium, titanium nitride, and/or alloys thereof. In an alternative, the base of the storage node may be directly on the exposed portion of the substrate.

The electronic structure may also include an insulating sidewall layer on sidewalls of the contact hole between the storage node and the interlayer insulating layer wherein the insulating sidewall layer and the interlayer insulating layer comprise different materials. More particularly, the insulating sidewall layer may comprise silicon nitride. In addition, the electronic structure may include an insulating surface layer on a surface of the interlayer insulating layer opposite the substrate wherein the insulating surface layer and the interlayer insulating layer comprise different materials. Moreover, the insulating surface layer may comprise silicon nitride, and the interlayer insulating layer may comprise silicon oxide. In addition, the storage node may comprise a conductive material such as doped polysilicon.

The electronic structure may also include a dielectric layer on exposed surface portions of the storage node, and a conductive layer on the dielectric layer opposite the storage node. In addition, the portion of the substrate exposed by the interlayer insulating layer may comprise a transistor source/drain region.

DETAILED DESCRIPTION OF THE INVENTION

Figure 1:
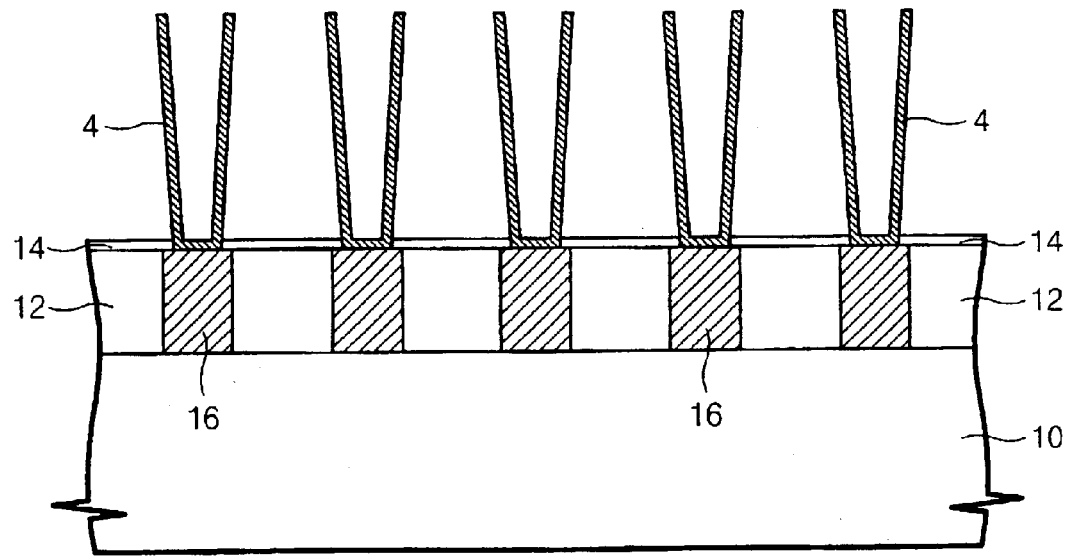
FIG. 1 is a cross-sectional view of conventional storage nodes.

The present invention will be described more fully hereinafter with reference to the accompanying drawings, in which embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, thicknesses of layers and regions are exaggerated for clarity. It will also be understood that when a layer is referred to as being "on" another layer or substrate, it may be directly on the other layer or substrate, or intervening layers may also be present. It will also be understood that when an element is referred to as being "coupled" or "connected" to another element, it can be directly coupled or connected to the other element or intervening elements may also be present. Like numbers refer to like elements throughout.

Figure 2:
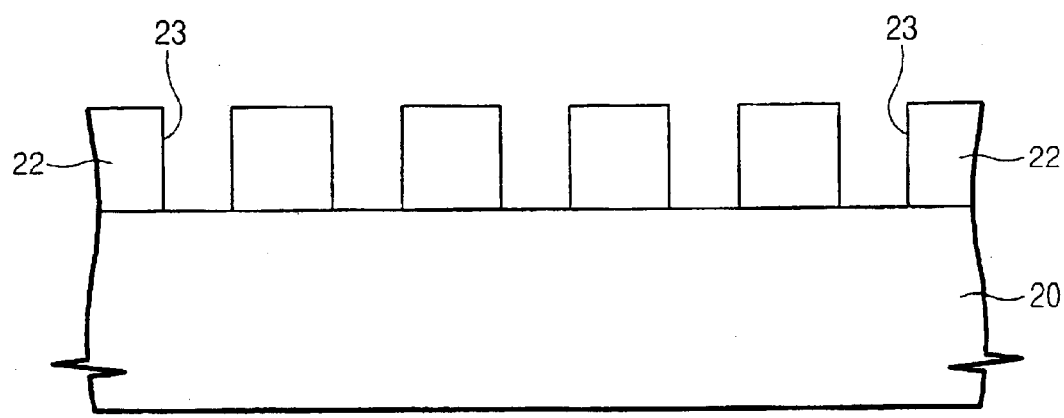
FIGS. 2 to 7 are cross-sectional views illustrating steps of forming storage nodes in accordance with embodiments of the present invention.

FIGS. 2 to 7 are cross-sectional views illustrating steps of forming storage nodes in accordance with first embodiments of the present invention. Referring to FIG. 2, an interlayer insulating layer 22 is formed on a surface of a substrate 20 and the interlayer insulating layer 22 is patterned to form a plurality of contact holes 23 exposing predetermined portions of the substrate 20. The portions of substrate 20 exposed within the contact holes 23 can be active areas of transistors or conductive patterns connected with active areas of transistors. The interlayer insulating layer 22 can be a silicon oxide layer.

Figure 3:
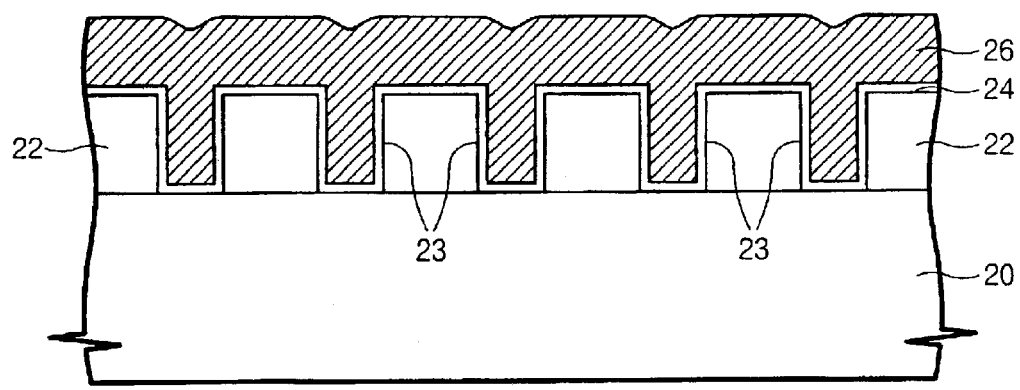

Referring to FIG. 3, a conductive layer 26 filling the contact holes 23 is formed on the surface of the interlayer insulating layer 22 in which the contact holes 23 are formed. The conductive layer 26 can be formed of tungsten, titanium, titanium nitride layer, and/or stacked layers thereof. Before forming the conductive layer 26, an etch stop layer 24 can be conformally formed on a surface of the interlayer insulating layer 22 in which the contact holes 23 are formed. The etch stop layer 24 can be formed of a material having an etch selectivity with respect to the interlayer insulating layer 22 and the conductive layer 26. For example, the etch stop layer 24 may be formed of silicon nitride.

Figure 4:
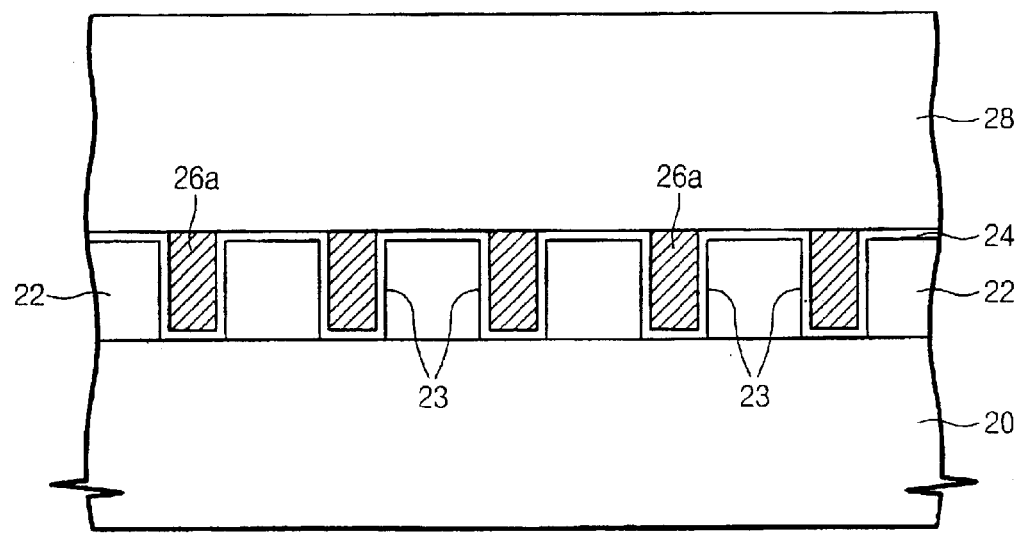

Referring to FIG. 4, the conductive layer 26 can be etched to form conductive layer patterns 26a within the respective contact holes 23. The conductive layer patterns 26a provide storage node plugs. The conductive layer 26 can be polished using a chemical mechanical polish (CMP) process. When using CMP, the etch stop layer 24 can be used as a CMP stopping layer in the CMP process. Then, a mold layer 28 can be formed on a surface of the resulting structure in which the storage node plugs 26a are formed. The mold layer 28 can be formed of silicon nitride.

Figure 5:
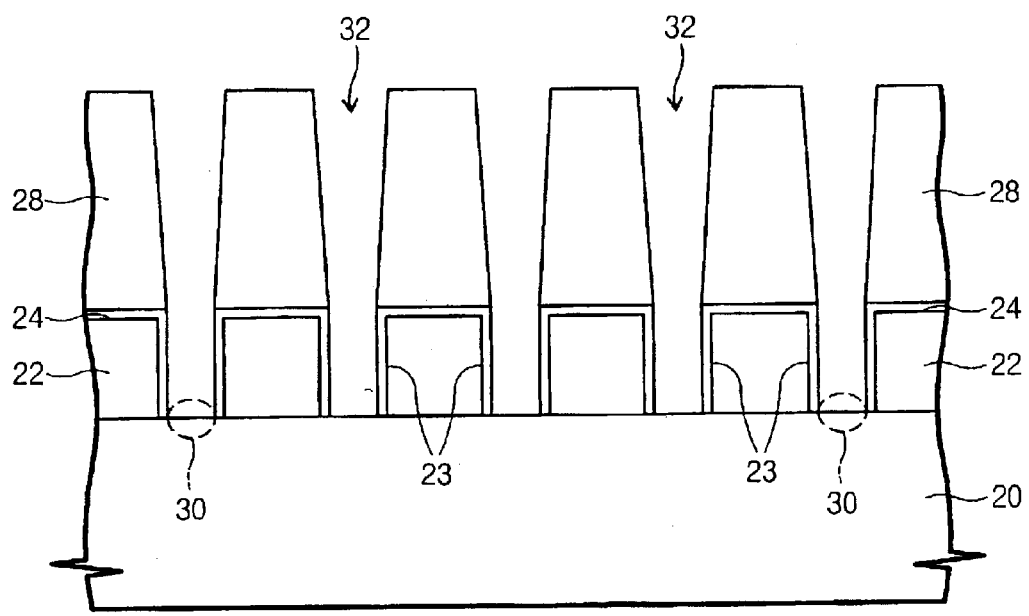

Referring to FIG. 5, the mold layer 28 and the etch stop layer 24 can be sequentially patterned to form storage node holes 32 exposing the respective storage node plugs 26a of FIG. 4. Because the mold layer 28 and the etch stop layer 24 have an etching selection ratio, they can be etched using a two-stage etching process. Accordingly, the etch stop layer 24 may reduce etching of the interlayer insulating layer 22 due to misalignment of an etching mask. Then, the storage node plugs 26a and the etch stop layer 24 disposed at a bottom of the contact holes 23 can be removed to expose predetermined portions 30 of the substrate 20. The storage node plugs 26a can be etched using a sulphuric acid solution, an oxygenated water, and/or a mixed solution thereof. A ratio of the sulphuric acid solution to the oxygenated water in the mixed solution can be 4:1. According to some embodiments of the present invention, the storage node plugs 26a can be completely removed to expose inner walls of the contact holes 23 and predetermined portions 30 of the substrate 20 disposed at the bottom of the contact holes 23.

Figure 6:
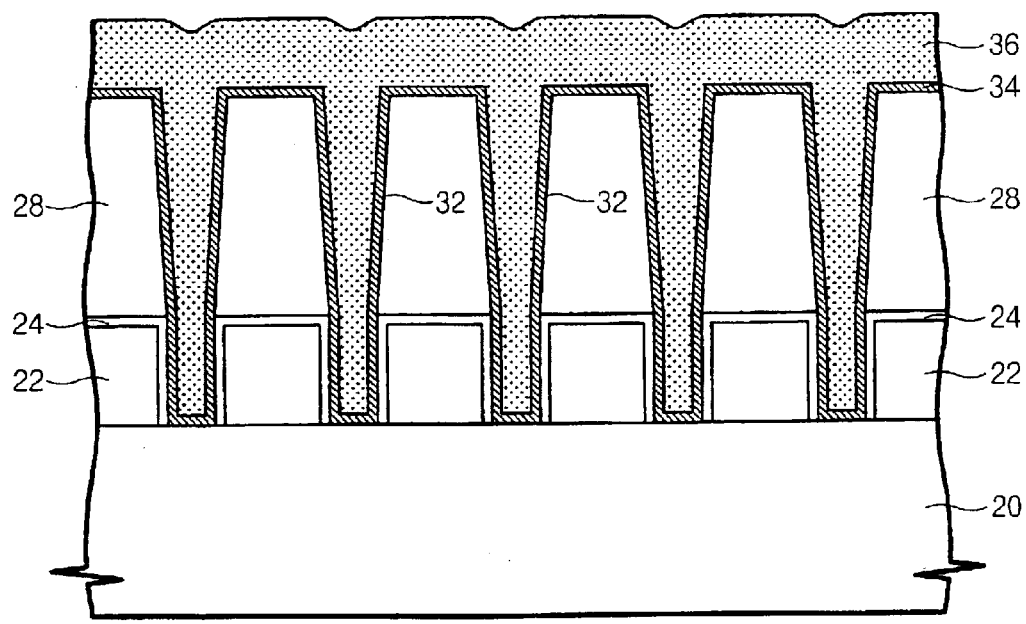

Referring to FIG. 6, a storage node layer 34 is formed to conformally cover inner walls of the storage node holes 32, inner walls of the contact holes 23, and exposed portions of substrate 30. A CMP sacrificial layer 36, filling a space surrounded by the storage node layer 34, can then be formed. The CMP sacrificial layer 36 can be a silicon oxide layer. For example, the CMP sacrificial layer 36 can be formed of an undoped silicate glass (USG).

Figure 7:
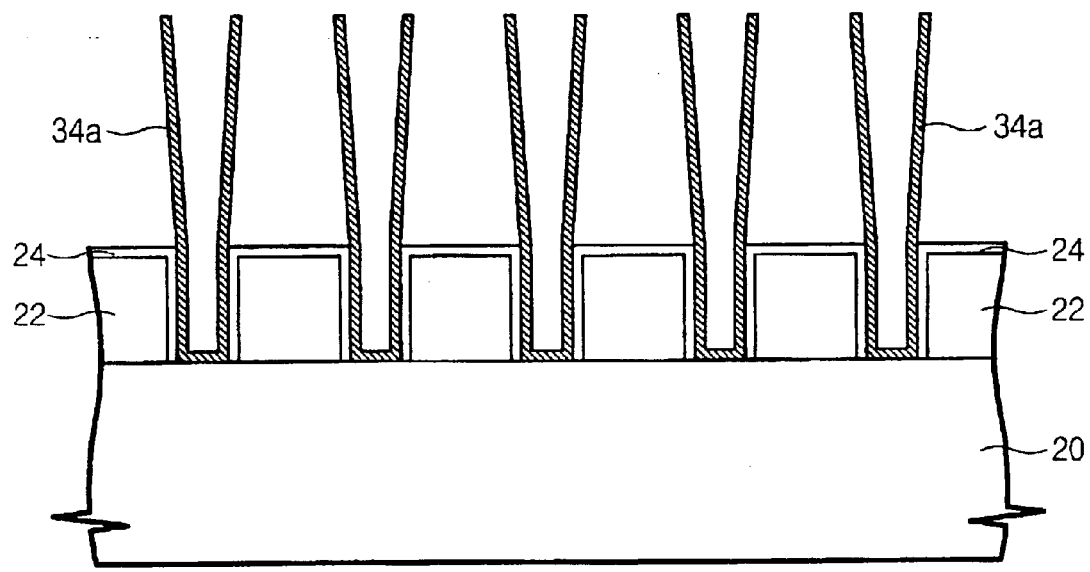

Referring to FIG. 7, the CMP sacrificial layer 36 and the storage node layer 34, which are formed on the mold layer 28, are sequentially polished to expose the mold layer 28, and storage nodes 34a are simultaneously formed within the respective storage node holes 32. The CMP sacrificial layer 36 disposed inside the storage nodes 34a and the mold layer 28 disposed outside the storage nodes 34a are then removed to expose the inner and outer walls of the storage nodes 34a. The etch stop layer 24 may reduce etching of the interlayer insulating layer 22 during removal of the mold layer 28. In addition, the etch stop layer 24 surrounds the upper portion and sidewalls of the interlayer insulating layer 22. Accordingly, the etch stop layer 24 can also reduce etching of the interlayer insulating layer 22 due to an etchant penetrating into an interface between the storage nodes 34a and the interlayer insulating layer 22.

As described above with respect to certain embodiments of the present invention, capacitance of a capacitor can be increased because the storage nodes extend to the inside of the contact holes in which the storage node plugs have existed. In addition, because the interlayer insulating layer 22 surrounds the lower portion of the storage nodes 34a and supports the storage nodes 34a, collapse of the storage nodes 34a can be reduced even when the storage nodes 34a are formed high relative to the substrate.

As shown in FIG. 7, each storage node 34a may be defined to include a base in a respective contact hole 23 and sidewalls extending away from the base and away from the substrate with portions of the sidewalls being within the contact hole and with portions of the sidewalls extending outside the contact hole beyond the interlayer insulating layer 22. As further shown in FIG. 7, the base of a storage node 34a may be adjacent the substrate 20 with no intervening layers therebetween. In alternative embodiments, intervening layers may be provided between a base of a storage node 34a and the substrate 20.

Figure 8:
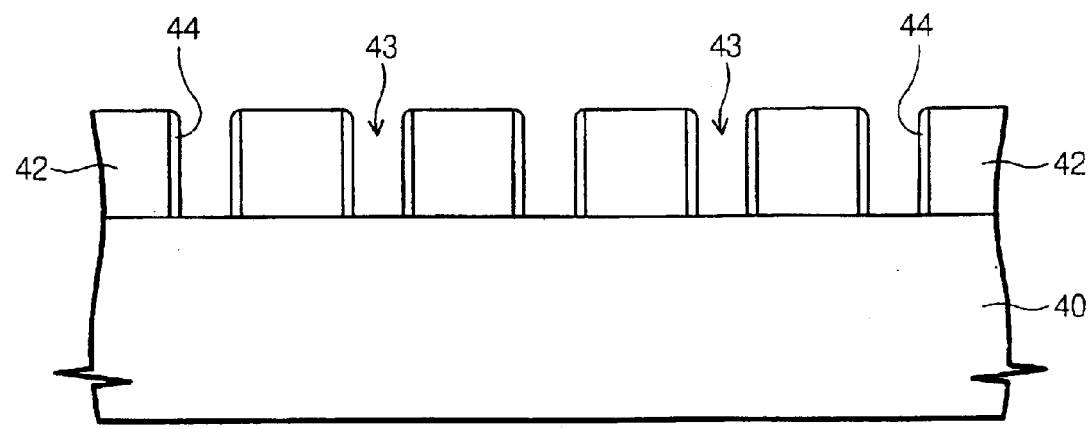
FIGS. 8 to 13 are cross-sectional views illustrating steps of forming storage nodes in accordance with embodiments of the present invention.

FIGS. 8 to 13 are cross-sectional views illustrating steps of forming storage nodes in accordance with further embodiments of the present invention. Referring to FIG. 8, an interlayer insulating layer 42 is formed on a surface of a substrate 40 and the interlayer insulating layer 42 is patterned to form a plurality of contact holes 43 exposing predetermined portions of the substrate 40. Sidewall spacers 44 are then formed on inner walls of the contact holes 43. The interlayer insulating layer 42 can be formed of a silicon oxide layer. The sidewall spacers 44 can be formed of a material having an etch selection ratio with respect the interlayer insulating layer 42. For example, the sidewall spacers 44 can be formed of silicon nitride. The sidewall spacers 44 can be formed by conformally forming a silicon nitride layer on a surface of the structure including the interlayer insulating layer 42 having contact holes 43 therein. The silicon nitride layer can then be eteched using an anisotropic etching process.

Figure 9:
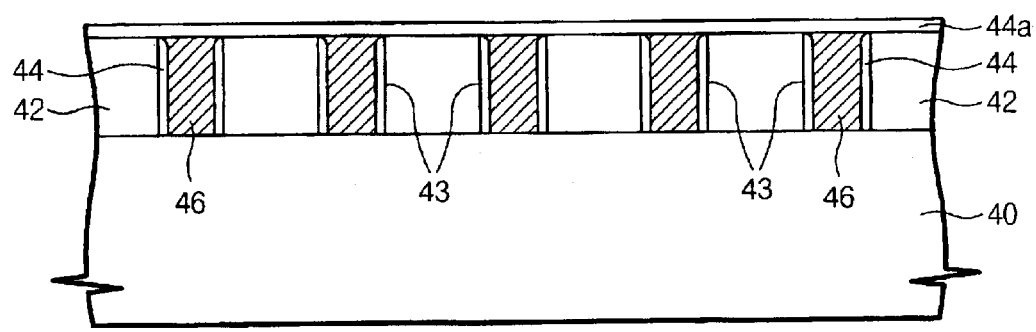

Referring to FIG. 9, conductive layer patterns 46 are formed in the respective contact holes 43. The conductive layer patterns 46 correspond to storage node plugs. The formation of the storage node plugs 46 can be achieved by forming a conductive layer filling the contact holes 43 and on a surface of the interlayer insulating layer 44 opposite the substrate and then polishing the conductive layer using a chemical mechanical polish (CMP) process. An etch stop layer 44a can then be formed on a surface of the resulting structure in which the storage node plugs 46 are formed. The etch stop layer 44a can be formed of silicon nitride. As a result, the etch stop layer 44a and the sidewall spacers 44 surround the upper portion and sidewalls of the interlayer insulating layer 42. Accordingly, etching of the interlayer insulating layer 42 can be reduced in subsequent process steps.

Figure 10:
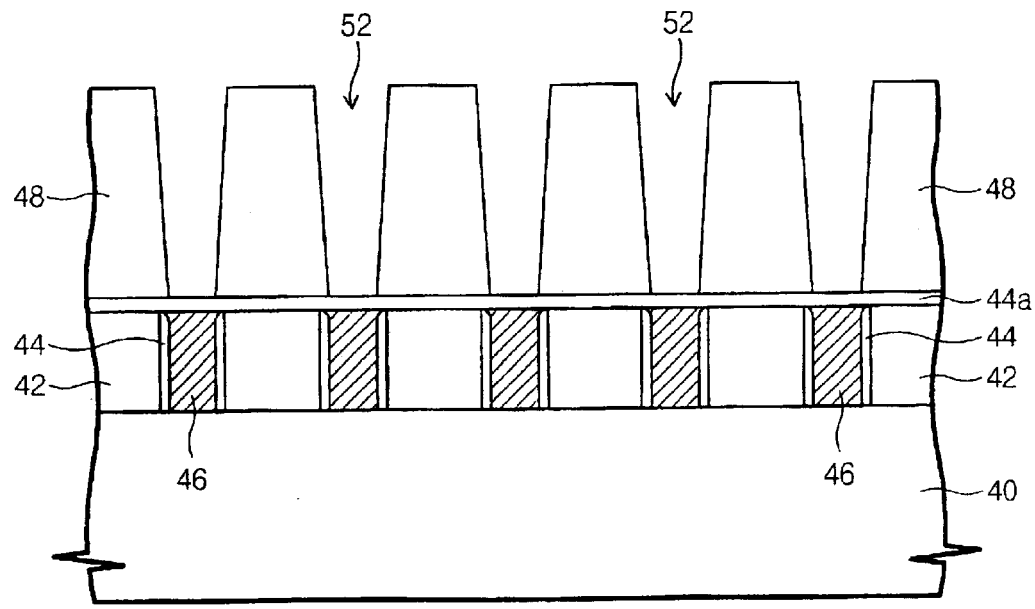

Referring to FIG. 10, a mold layer 48 can be formed on a surface of the resulting structure including the etch stop layer 44a. The mold layer 48 can be formed of silicon oxide. The mold layer 48 can then be patterned to form storage node holes 52 exposing the etch stop layer 44a disposed at upper portions of respective storage node plugs 46.

Figure 11:
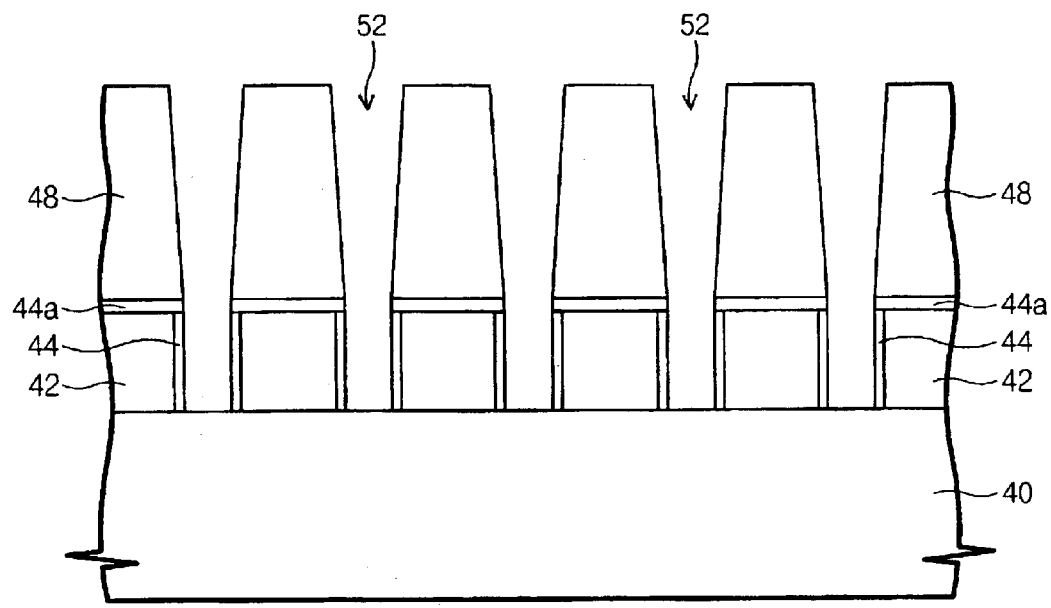
Figure 12:
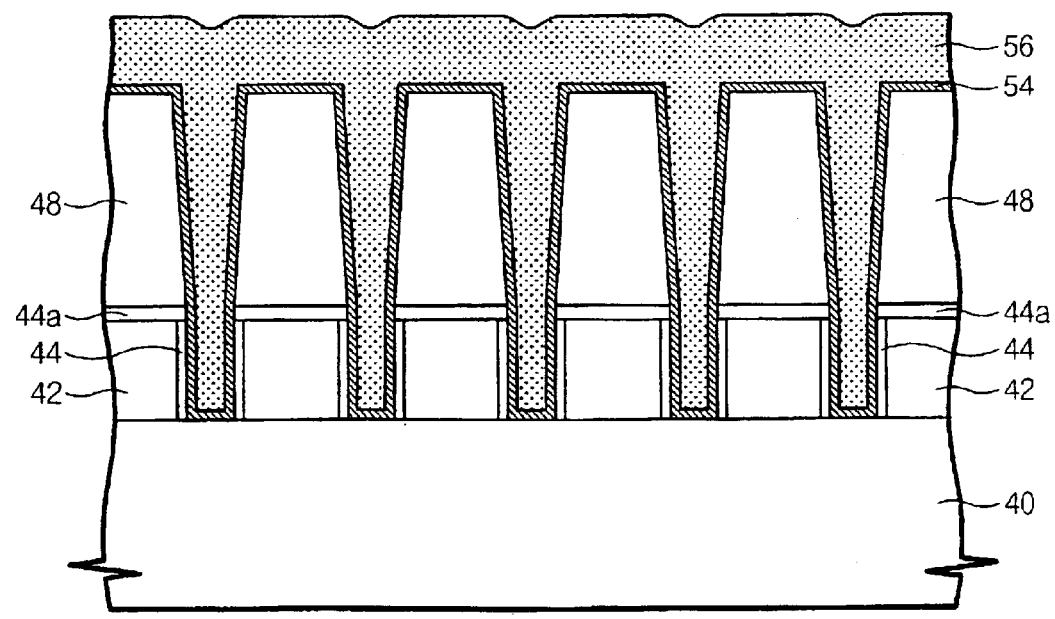

Referring to FIG. 11, the etch stop layer 44a and the storage node plugs 46 can be removed using the mold layer 48 as an etching mask. At this time, the storage node plugs 46 can be etched using a sulphuric acid solution, an oxygenated water, and/or a mixed solution thereof as discussed above with respect to first embodiments of the present invention. Referring to FIG. 12, a storage node layer 54 can be conformally formed on a surface of the structure including the mold layer 48 and the interlayer insulating layer 42 from which the storage node plugs 46 have been removed. Then, a CMP sacrificial layer 56 can be formed on the storage node layer 54 filling a space surrounded by the storage node layer 54.

Figure 13:
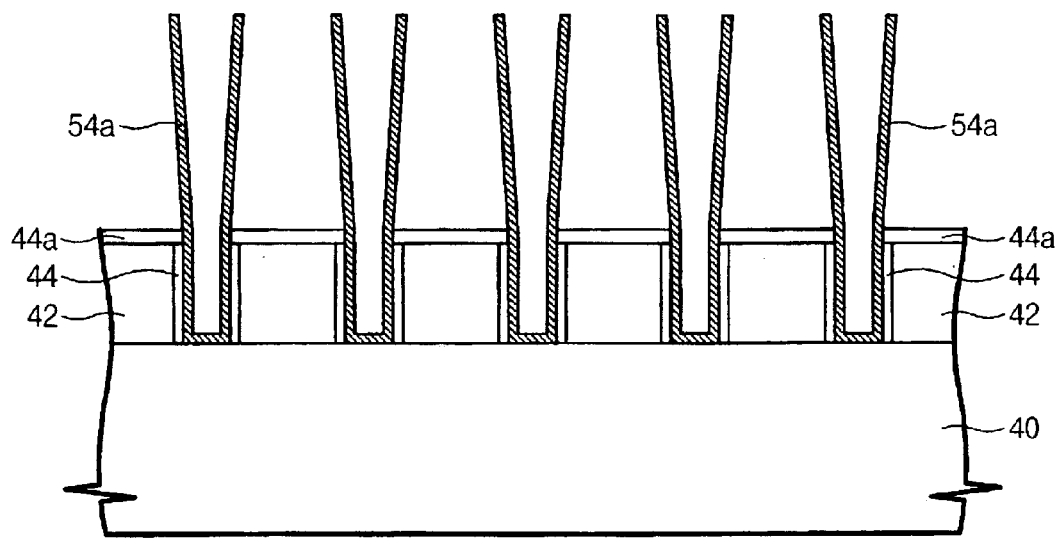

Referring to FIG. 13, portions of the CMP sacrificial layer 56 and the storage node layer 54 on the mold layer 48 are polished using a CMP process to expose a surface of the mold layer 48, and to provide separate storage nodes 54a within the respective storage node holes 52. The CMP sacrificial layer 56 disposed inside the storage nodes 54a and the mold layer 48 disposed outside the storage nodes 54a can be sequentially removed to expose inner and outer walls of the storage nodes 54a. At this time, as described above, the sidewall spacers 44 and the etch stop layer 44a can reduce etcing of the interlayer insulating layer 42 due to an etchant penetrating into an interface between the storage nodes 54a and the interlayer insulating layer 42 when the etchant is used to remove the mold layer 48.

As shown in FIG. 13, each storage node 54a may be defined to include a base in a respective contact hole 43 and sidewalls extending away from the base and away from the substrate with portions of the sidewalls being within the contact hole and with portions of the sidewalls extending outside the contact hole beyond the interlayer insulating layer 42. As further shown in FIG. 13, the base of a storage node 54a may be adjacent the substrate 40 with no intervening layers therebetween. In alternative embodiments, intervening layers may be provided between a base of a storage node 54a and the substrate 40.

Figure 14:
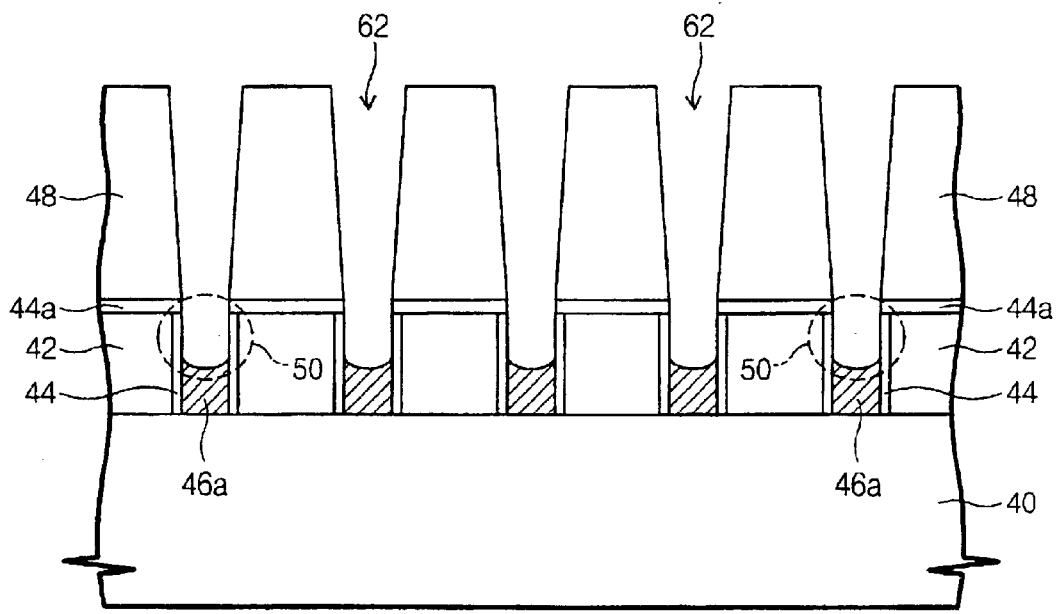
FIGS. 14 to 16 are cross-sectional views illustrating steps of forming storage nodes in accordance with embodiments of the present invention.
Figure 15:
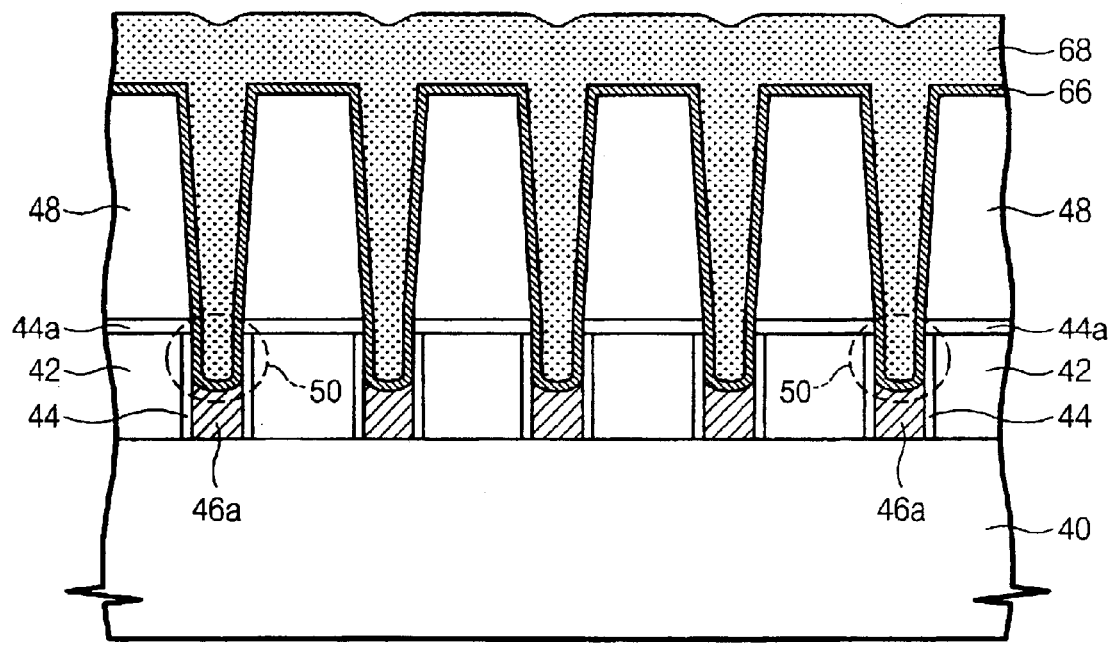
Figure 16:
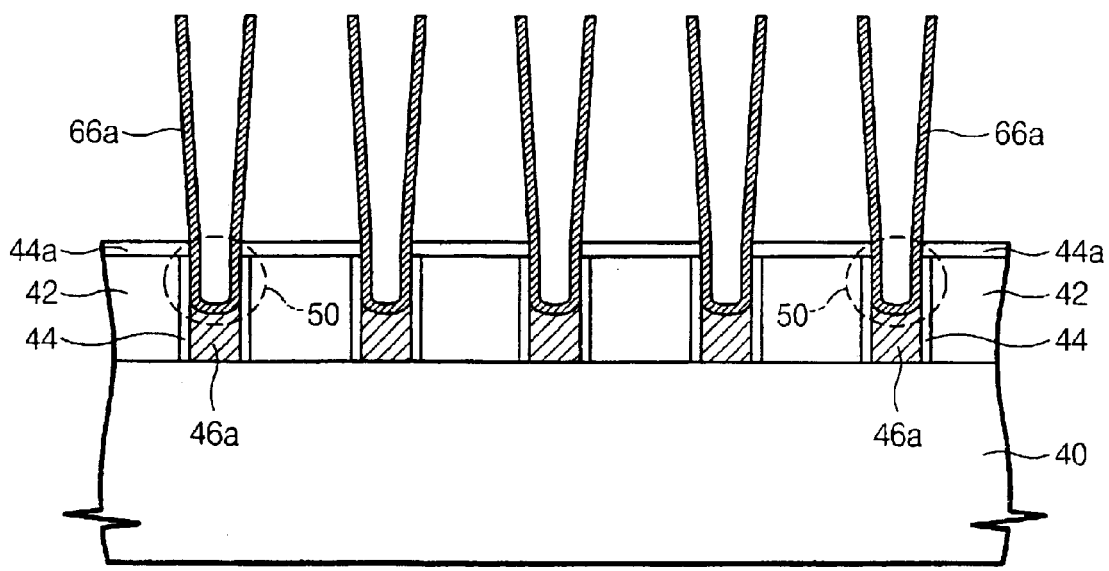

FIGS. 14 to 16 are cross-sectional views illustrating steps of forming storage nodes according to additional embodiments of the present invention. Steps corresponding to those of FIGS. 7 to 10 can be the same as discussed above with respect to second embodiments of the present invention. Then, referring to FIG. 14, the etch stop layer 44a can be etched using the mold layer 48 as an etching mask to thereby expose the storage node plugs 46. Parts 50 of the upper portions of the storage node plugs 46 are then removed to form modified storage nodes 46a.

Referring to FIG. 15, a storage node layer 66 is conformally formed on a surface of the resulting structure in which the parts 50 of the storage node plugs have been removed. A CMP sacrificial layer 68 is then formed on the storage node layer 66 filling a space within the storage node holes 62 surrounded by the storage node layer 66.

Referring to FIG. 16, the CMP sacrificial layer 68 and the storage node layer 66 are sequentially polished to expose surface portions of the mold layer 48 opposite the substrate, and to provide separate storage nodes 66a within the respective storage node holes. The CMP sacrificial layer 68 disposed inside the storage nodes 66a and the mold layer 48 disposed outside the storage nodes 66a can then be sequentially removed to expose inner and outer walls of the storage nodes 66a. As a result, the respective storage nodes 66a extend to a predetermined depth of the interlayer insulating layer 42.

As shown in FIG. 16, each storage node 66a may be defined to include a base in a respective contact hole and sidewalls extending away from the base and away from the substrate with portions of the sidewalls being within the contact hole and with portions of the sidewalls extending outside the contact hole beyond the interlayer insulating layer 42. As further shown in FIG. 16, a modified storage node 46a may be provided within the contact hole between the base of a storage node 66a and the substrate 40.

Figure 17:
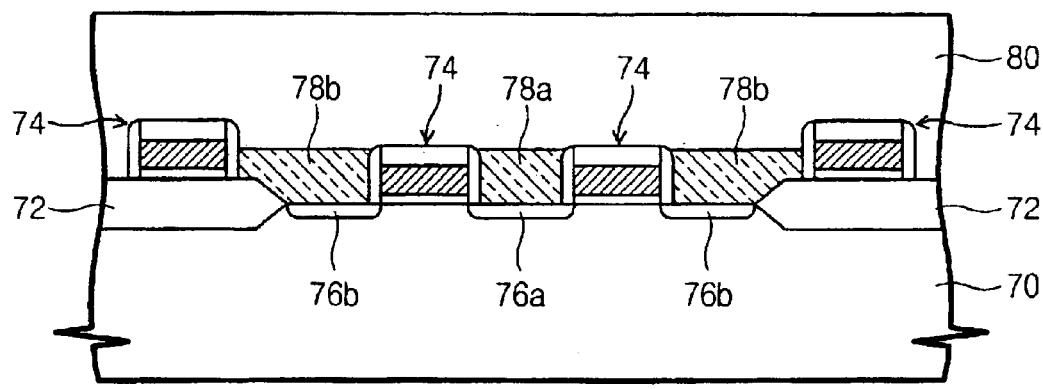
FIGS. 17 to 21 are cross-sectional views illustrating steps of forming storage nodes in accordance with embodiments of the present invention.

FIGS. 17 to 21 are cross-sectional views illustrating steps of forming storage nodes in accordance with further embodiments of the present invention. Referring to FIG. 17, device isolation layers 72 can be formed on predetermined portions of a semiconductor substrate 70 to thereby define active areas. A plurality of gate patterns 74 can then be formed on the active areas. Source regions 76b and drain regions 76a can be formed by implanting impurities (dopants) into the active areas disposed at both sides of the respective gate patterns 74. Source contact patterns 78b and drain contact patterns 78a are connected to the source regions 76b and the drain regions 76a, respectively. An interlayer insulating layer 80 can then be formed on an entire surface of the structure including the source contact patterns 78b and the drain contact patterns 78a. Although not shown, bit lines connected to the drain contact patterns 78a can be formed within the interlayer insulating layer 80.

Figure 18:
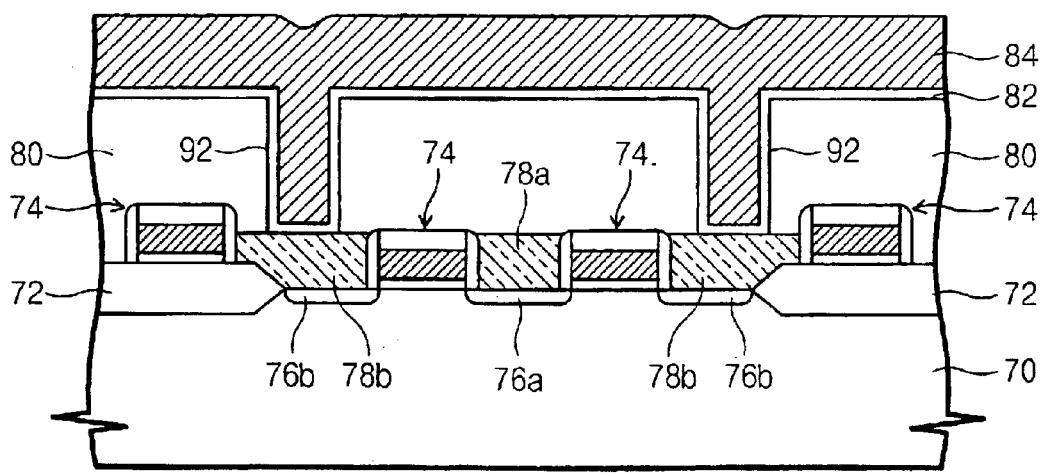

Referring to FIG. 18, the interlayer insulating layer 80 can be patterned to form contact holes 92 exposing portions of the respective source contact patterns 78b. A conductive layer 84 filling the contact holes 92 can be formed on the entire surface of the interlayer insulating layer including the contact holes 92. The conductive layer 84 can be formed of tungsten, titanium, titanium nitride layer, and/or stacked layers thereof. Before forming the conductive layer 84, the etch stop layer 82 can be conformally formed on a surface of the interlayer insulating layer including the contact holes 92. The etch stop layer 82 can be formed of a material having an etching selectivity with respect to the interlayer insulating layer 80 and the conductive layer 84. For example, the etch stop layer 82 can be formed of silicon nitride.

Figure 19:
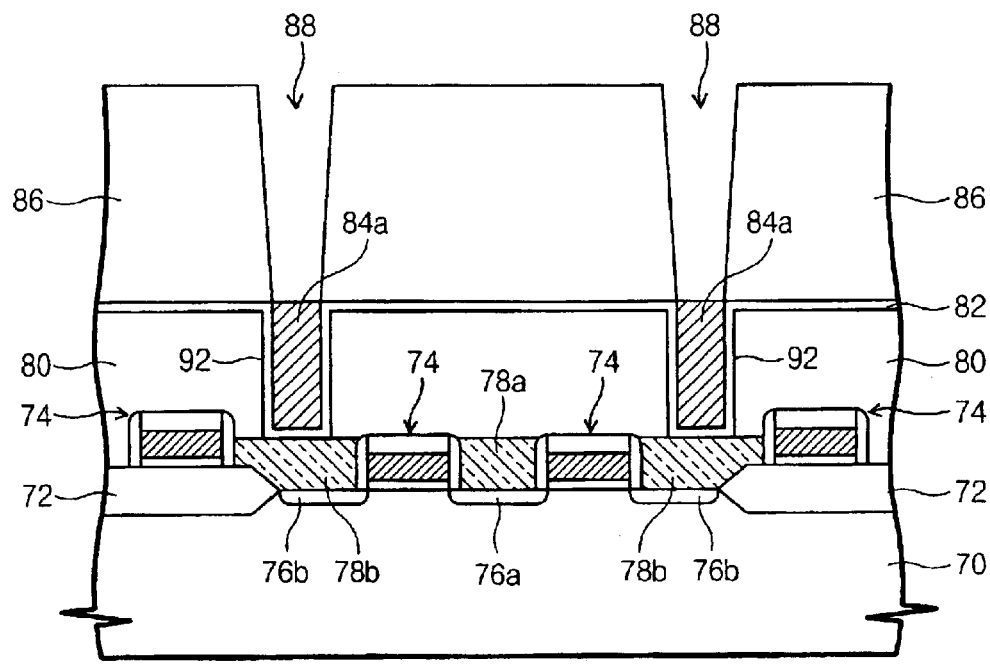

Referring to FIG. 19, the conductive layer 84 can be etched to form conductive layer patterns 84a within the respective contact holes 92. The conductive layer patterns 84a correspond to storage node plugs. The conductive layer 84 can be polished using a chemical mechanical polish (CMP) process. In that case, the etch stop layer 82 can be used as a CMP stopping layer in the CMP process. A mold layer 86 can then be formed on a surface of the resulting structure in which the storage node plugs 84a are formed. The mold layer 86 can be formed of silicon nitride. The mold layer 86 and the etch stop layer 82 can be sequentially patterned to form storage node holes 88 exposing the respective storage node plugs 84a. Because the mold layer 86 and the etch stop layer 82 have an etching selectivity, the etch stop layer 82 can be etched after etching the mold layer 86 using an etch recipe having a high etching ratio with respect to the mold layer 86 and the interlayer insulating layer 80. Accordingly, the etch stop layer 82 can reduce etching of the interlayer insulating layer 80 due to a misalignment of an etching mask.

Figure 20:
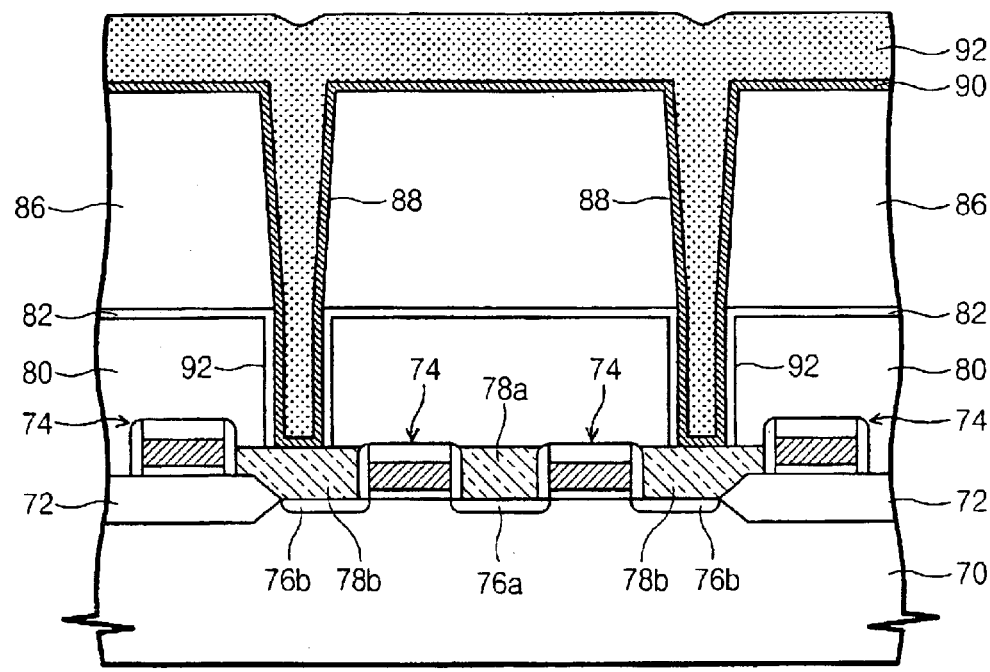

Referring to FIG. 20, the storage node plugs 84a and the etch stop layer 24 disposed at a lower portion of the storage node plugs 84a can be removed to expose the source contact plugs 78b. The storage node plugs 84a can be etched using a sulphuric acid solution, an oxygenated water, and/or a mixed solution thereof. A ratio of the sulphuric acid solution to the oxygenated water in the mixed solution can be 4:1.

A storage node layer 90 can be formed to conformally cover the inner walls of the storage node holes 88, the etch stop layer 82 on inner walls of the contact holes 92, and upper surfaces of the exposed source contact patterns 78b. A CMP sacrificial layer 92 can be formed filling a space surrounded by the storage node layer 90. The CMP sacrificial layer 92 can be formed of silicon oxide. For example, the CMP sacrificial layer 92 can be formed of an undoped silicate glass (USG).

Figure 21:
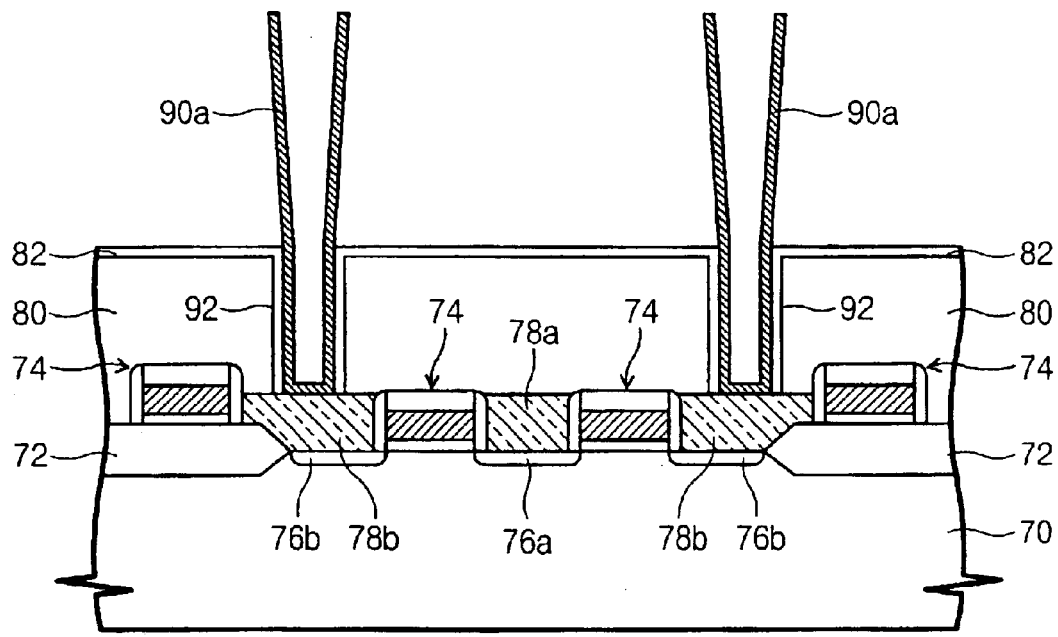

Referring to FIG. 21, the CMP sacrificial layer 92 and the storage node layer 90 can be sequentially polished to expose portions of the mold layer 86 opposite the substrate, and to provide separate storage nodes 90a within the respective storage node holes 88. Then, the CMP sacrificial layer 92 disposed inside the storage nodes 90a and the mold layer 86 disposed outside the storage nodes 90a can be removed to expose the inner and outer walls of the storage nodes 90a. The etch stop layer 82 can reduce etching of the interlayer insulating layer 80 during removal of the mold layer 86. In addition, the etch stop layer 82 surrounds the upper portion and sidewalls of the interlayer insulating layer 80. Accordingly, the etch stop layer 82 can also reduce etching of the interlayer insulating layer 80 due to an etchant penetrating into an interface between the storage nodes 90a and the interlayer insulating layer 80.

As described above, in accordance with embodiments of the present invention, the storage nodes 90a extend to the inside of the contact holes 92 in which the storage node plugs have existed, so that the storage nodes 90a can be connected to the source contact patterns 78b. Accordingly, the surface area of the storage nodes 90a can be increased as much as the depth extended to the inside of the contact hole 92, so that the capacitance of capacitor can be also increased. In addition, since the interlayer insulating layer 80 surrounds the lower portion of the storage nodes 90a and supports the storage nodes 90a, collapse of the storage nodes 90a can be reduced even when the storage nodes 90a are formed high.

As shown in FIG. 21, each storage node 90a may be defined to include a base in a respective contact hole and sidewalls extending away from the base and away from the substrate with portions of the sidewalls being within the contact hole and with portions of the sidewalls extending outside the contact hole beyond the interlayer insulating layer 80. As further shown in FIG. 21, the base of a storage node 90a may be adjacent a source region 76b of substrate 70 with no intervening layers therebetween. In alternative embodiments, intervening layers may be provided between a storage node 90a and the substrate 70.

Figure 22:
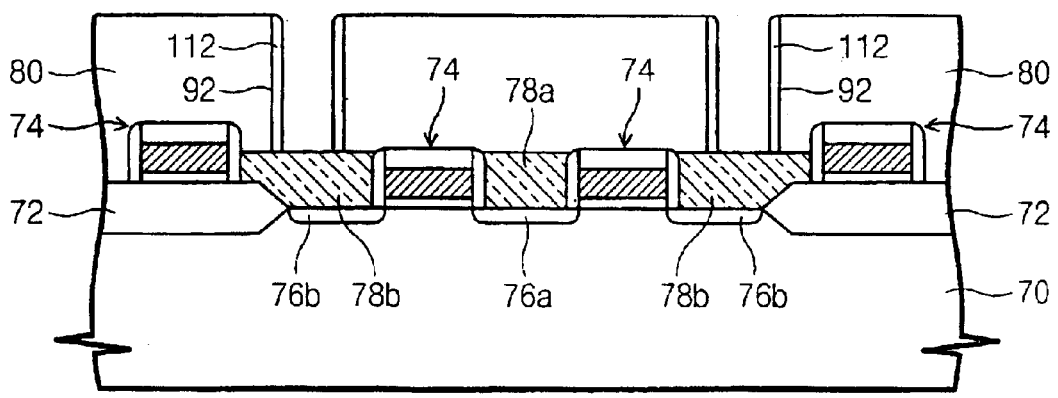
FIGS. 22 to 26 are cross-sectional views illustrating steps of forming storage nodes in accordance with embodiments of the present invention.

FIGS. 22 to 26 are cross-sectional views illustrating steps of forming storage nodes in accordance with additional embodiments of the present invention. Referring to FIG. 22, the steps performed until the interlayer insulating layer 80 is formed can be the same as discussed above with respect to fourth embodiments of the present invention illustrated in FIG. 17. The interlayer insulating layer 80 can then be patterned to form contact holes 92 exposing the source contact patterns 78b. Insulating sidewall spacers 112 can be formed on the inner walls of the contact holes 92. The interlayer insulating layer 80 can be formed of silicon oxide. The insulating sidewall spacers 112 can be formed of a material having an etching selection ratio with respect to the interlayer insulating layer 80. For example, the insulating sidewall spacers 112 can be formed of silicon nitride. The insulating sidewall spacers 112 can be formed by conformally forming a silicon nitride layer on a surface of the interlayer insulating layer 80 including contact holes 92, and then etching the silicon nitride layer using an anisotropic etching process.

Figure 23:
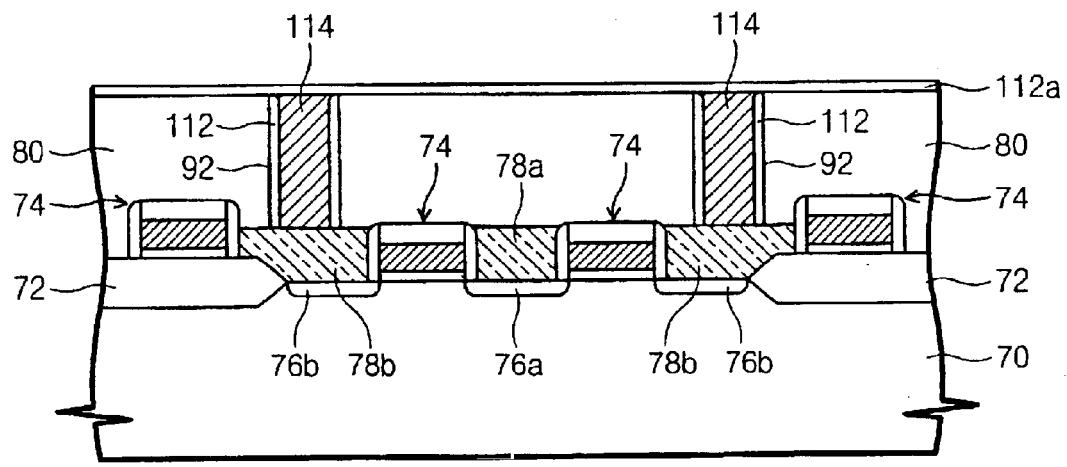

Referring to FIG. 23, conductive layer patterns 114 are formed on the respective contact holes 92. The conductive layer patterns 114 correspond to storage node plugs. The formation of the storage node plugs 114 can be achieved by forming a conductive layer filling the contact holes 92 on a surface of the interlayer insulating layer 80 and then polishing the conductive layer using a chemical mechanical polish (CMP) process. Then, an etch stop layer 112a is formed on a surface of the resulting structure including interlayer insulating layer 80 and storage node plugs 114. The etch stop layer 112a can be formed of silicon nitride. As a result, the etch stop layer 112a and the insulating layer patterns 112 surround the upper portion and sidewalls of the interlayer insulating layer 80. Therefore, etching of the interlayer insulating layer 80 can be reduced in subsequent process steps.

Figure 24:
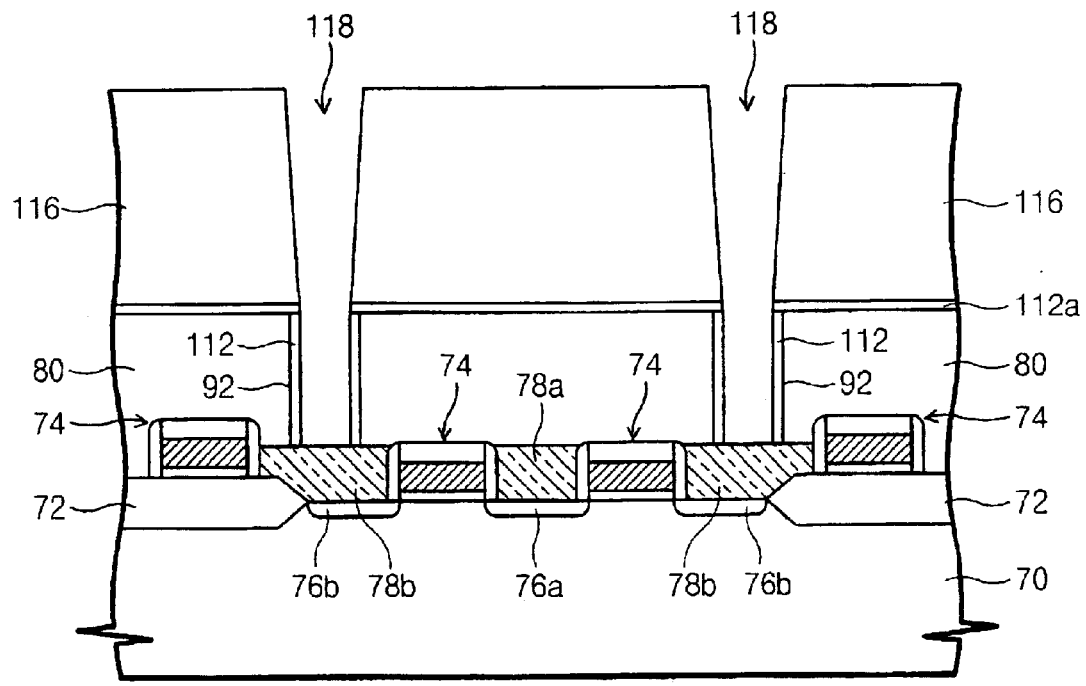

Referring to FIG. 24, a mold layer 116 can be formed on an entire surface of the resulting structure including the etch stop layer 112a. The mold layer 116 can be formed of silicon oxide. Then, the mold layer 116 can be patterned to form storage node holes 118 exposing the etch stop layer 112a disposed at the upper portion of the storage node plugs 114. The etch stop layer 112a and the storage node plugs 114 are removed using the mold layer 116 as an etching mask to thereby expose the source contact patterns 78b. At this time, like the above-described embodiments of the present invention, the storage node plugs 114 can be etched using a sulphuric acid solution, an oxygenated water, and/or a mixed solution thereof.

Figure 25:
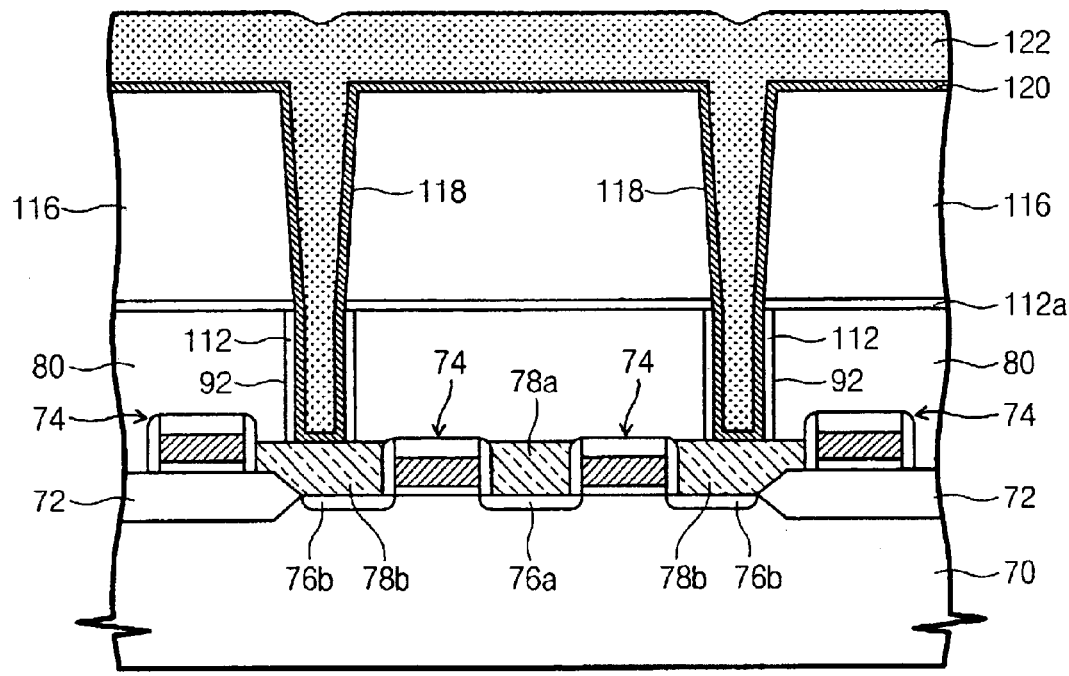

Referring to FIG. 25, a storage node layer 120 is conformally formed on the mold layer 116, in the storage node holes 118, and in the contact holes 92 from which the storage node plugs 114 have been removed. Then, a CMP sacrificial layer 122 is formed on the storage node layer 120 filling space in the storage node holes 118 and contact holes 92 surrounded by the storage node layer 120.

Figure 26:
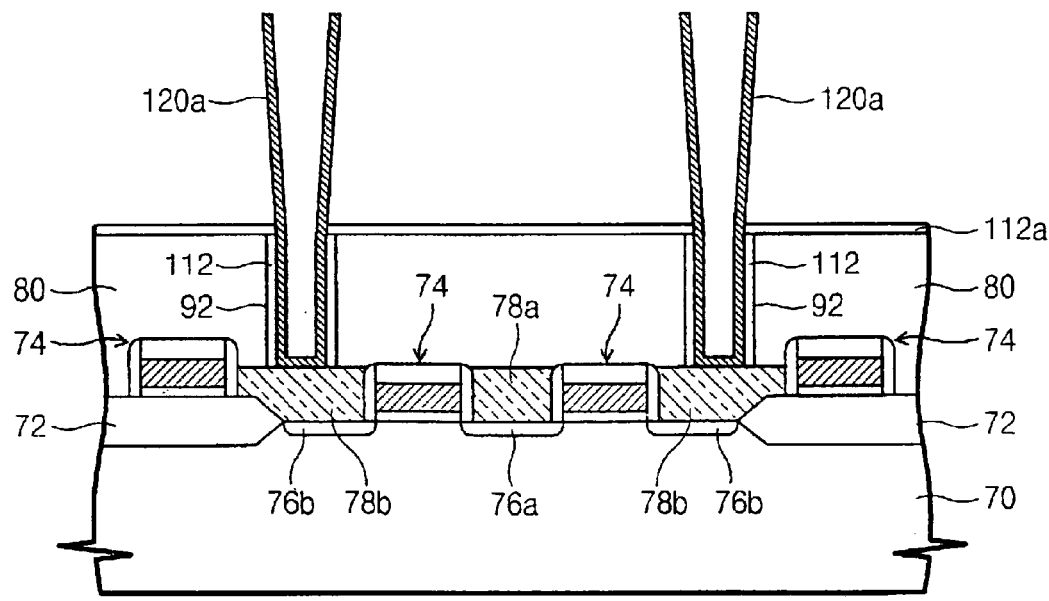

Referring to FIG. 26, the CMP sacrificial layer 122 and the storage node layer 120 can be polished using a CMP process to thereby expose surface portions of the mold layer 116 opposite the substrate, and to provide separate storage nodes 120a within the respective storage node holes 118. The CMP sacrificial layer 122 disposed inside the storage nodes 120a and the mold layer 116 disposed outside the storage nodes 120a can be sequentially removed to expose the inner and outer walls of the storage nodes 120a. At this time, as described above, the insulating layer patterns 112 and the etch stop layer 112a can reduce etching of the interlayer insulating layer 80 due to an etchant penetrating into an interface between the storage nodes 120a and the interlayer insulating layer 80 when the etchant is used to remove the mold layer 116.

As shown in FIG. 26, each storage node 120a may be defined to include a base in a respective contact hole 92 and sidewalls extending away from the base and away from the substrate with portions of the sidewalls being within the contact hole and with portions of the sidewalls extending outside the contact hole beyond the interlayer insulating layer 80. As further shown in FIG. 26, the base of a storage node 120a may be adjacent a source contact of the substrate 20 with no intervening layers therebetween. In alternative embodiments, intervening layers may be provided between a base of a storage node 120a and the substrate 70.

Figure 27:
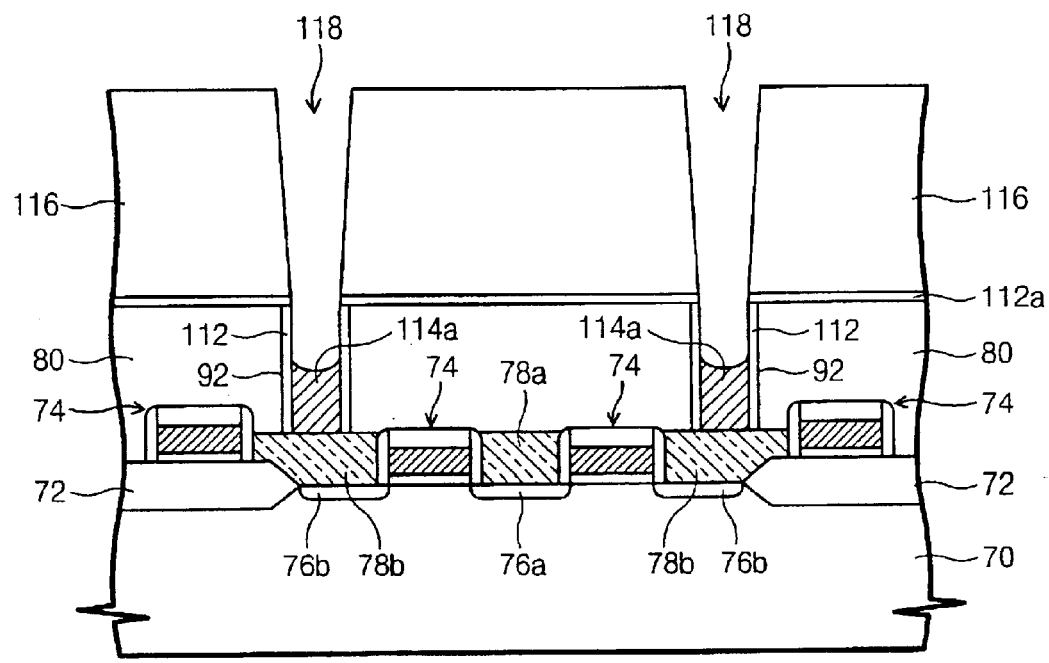
FIGS. 27 to 29 are cross-sectional views illustrating steps of forming storage nodes in accordance with embodiments of the present invention.
Figure 28:
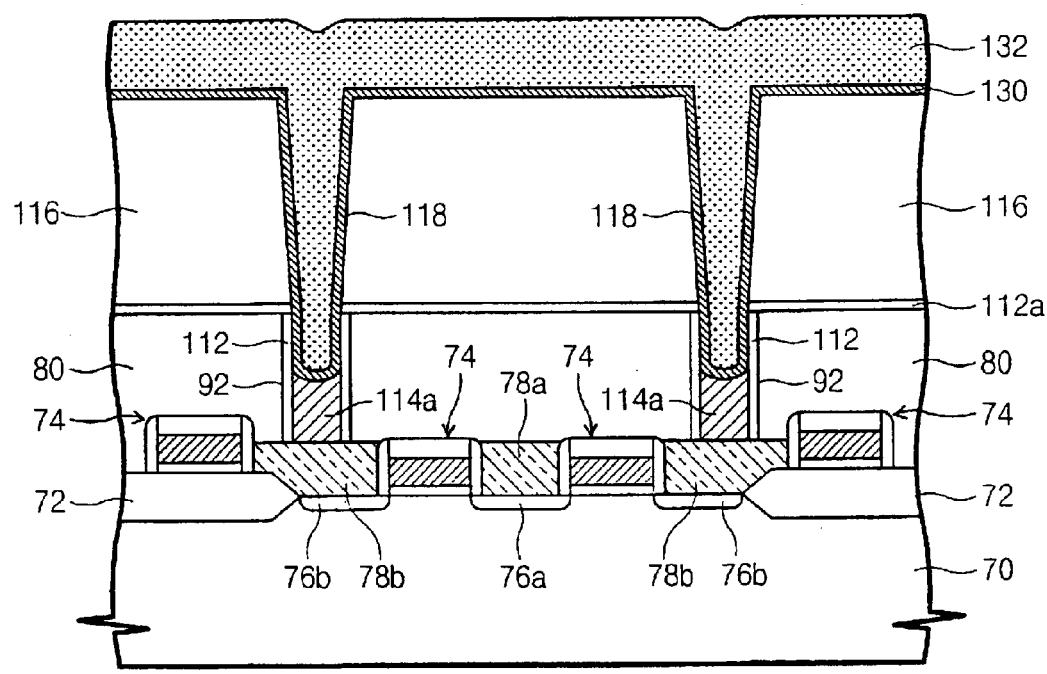
Figure 29:
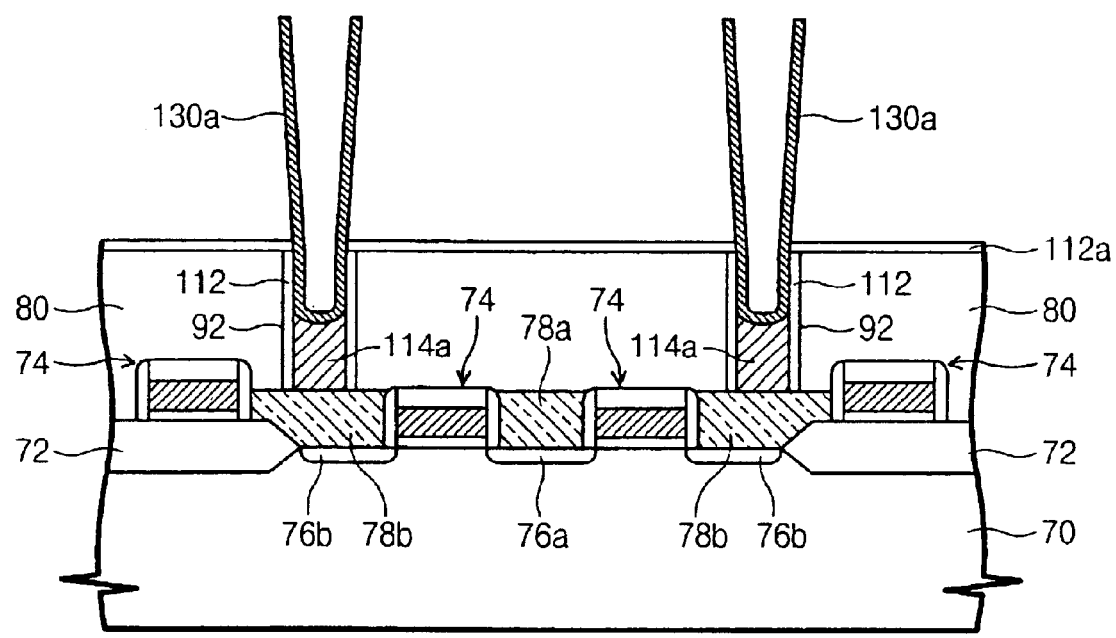

FIGS. 27 to 29 are cross-sectional views illustrating steps of forming storage nodes in accordance with yet further embodiments of the present invention. Referring to FIG. 27, the steps performed up to forming the storage node holes 118 can be the same as discussed above with respect to fifth embodiments of the present invention. The etch stop layer 112a can then be etched using the mold layer 116 as an etching mask to thereby expose the storage node plugs 114. Sequentially, upper portions of the storage node plugs 114 can be removed to provide modified storage node plugs 114a.

Referring to FIG. 28, a storage node layer 130 can be conformally formed on a surface of the structure including the molding layer 116, the interlayer insulating layer 80, the storage node holes, and the contact holes 92 in which the modified storage node plugs 114a are formed. Then, a CMP sacrificial layer 132 is formed on the storage node layer 130 filling a space in the storage node holes 188 and in the contact holes 92 surrounded by the storage node layer 130.

Referring to FIG. 29, the CMP sacrificial layer 132 and the storage node layer 130 can be sequentially polished to expose surface portions of the mold layer 116 opposite the substrate, and to provide separate storage nodes 130a within the respective storage node holes 118. The CMP sacrificial layer 131 disposed inside the storage nodes 130a and the mold layer 116 disposed outside the storage nodes 130a can be sequentially removed to expose the inner and outer walls of the storage nodes 130a.

As shown in FIG. 29, each storage node 130a may be defined to include a base in a respective contact hole 92 and sidewalls extending away from the base and away from the substrate with portions of the sidewalls being within the contact hole and with portions of the sidewalls extending outside the contact hole beyond the interlayer insulating layer 80. As further shown in FIG. 29, a modified storage node plug may be provided between the base of a storage node 130a and a source contact of the substrate 70.

As described above in accordance with embodiments of the present invention, because lower portions of the storage nodes extend to a predetermined depth of the interlayer insulating layer, the surface area can be increased while maintaining the height of the storage node from the top surface of the interlayer insulating layer. In addition, since the interlayer insulating layer supports the lower portion of the storage nodes, collapse of the storage nodes can be reduced even when a height of the storage nodes is increased. As a result, embodiments of the present invention can reduce 2-bit failure caused by collapse of storage nodes and can also increase surface areas of the storage nodes. Further, by forming the storage node holes and performing an anisotropic etching process to conductive storage node plugs therein, the storage nodes can be formed high. Thus, compared with prior techniques, embodiments of the present invention can reduce an etching burden of the mold layer when forming the storage node plugs having the same height, thereby providing more stable processes.

In each of the structures illustrated in FIGS. 7, 13, 16, 21, 26, and 29, a dielectric layer can be formed on the storage nodes, and a second electrode layer can then be formed on the dielectric layer opposite the storage nodes. DRAM memory cell capacitors can thus be provided.

Embodiments of the present invention may provide methods of forming storage nodes capable of increasing capacitance of a capacitor. Additional embodiments of the present invention may provide methods of forming storage nodes wherein a shorting phenomenon between the storage nodes can be reduced.

According to embodiments of the present invention, methods of forming cylinder-type storage nodes may be provided. According to methods of present invention, an interlayer insulating layer can be formed on a substrate, and the interlayer insulating layer can be etched to form contact holes exposing predetermined portions of the substrate. Storage node plugs can be formed within the respective contact holes and a mold layer can be formed on an entire surface of the substrate. The mold layer can be patterned to form a plurality of storage node holes exposing the respective storage node plugs. At least part of an upper portion of each storage node plug can be etched using the mold layer as an etching mask. At this time, the storage node plugs can be completely removed. Storage nodes extending to a predetermined depth of the contact holes can thus be formed, wherein the storage nodes conformally cover inner walls and bottoms of the respective storage node holes. Finally, the mold layer can be removed to expose outer walls of the storage nodes disposed at an upper portion of the interlayer insulating layer.

While this invention has been particularly shown and described with reference to preferred embodiments thereof, it will be understood by those skilled in the art that various changes in form and details may be made therein without departing from the spirit and scope of the invention as defined by the appended claims and their equivalents.

What is claimed is:

1. A method of forming storage nodes, the method comprising the steps of:
    forming transistors on predetermined portions of a semiconductor substrate;
    forming source contact patterns and drain contact patterns connected to respective sources and drains of the transistors, respectively;
    forming an interlayer insulating layer on an entire surface of the substrate in which the source contact patterns and the drain contact patterns are formed wherein the interlayer insulating layer has contact holes;
    forming storage node plugs passing through the contact holes in the interlayer insulating layer and connected to the source contact patterns, wherein the formation of the storage node plugs comprises the steps of,
        conformally forming an insulating etch stop layer on an entire surface of the substrate in which the contact holes are formed and in the contact holes,
        forming a conductive layer on an entire surface of the substrate in which the insulating etch stop layer is formed, the conductive layer filling the contact holes, and
        etching the conductive layer to expose the insulating etch stop layer formed on the interlayer insulating layer and simultaneously form conductive layer patterns within the respective contact holes;
    forming a mold layer on an entire surface of the resulting structure in which the storage node plugs are formed;
    patterning the mold layer to form storage node holes exposing the storage node plugs;
    etching the storage node plugs using the mold layer with the storage node holes as an etching mask, wherein the etching of the storage node plugs comprises the steps of,
        completely removing the storage node plugs to expose the insulating etch stop layer disposed at sidewalls and bottom of the contact holes, and
        removing the insulating etch stop layer disposed at the bottom of the contact holes thereby exposing portions of the source contact patterns;
    forming storage nodes in the contact holes, the storage nodes covering sidewalls of the storage node holes and being electrically coupled with the source contact patterns; and
    removing the mold layer to expose outer walls of the storage nodes.

2. The method of claim 1, wherein the storage node plugs are formed of tungsten, titanium or titanium nitride layer.

3. The method of claim 1, wherein the storage node plugs are etched using oxygenated water, sulphuric acid solution or a mixed solution thereof.

4. The method of claim 1, wherein the formation of the storage nodes comprises the steps of:
    conformally forming a storage node layer on an entire surface of the substrate in which the storage node plugs are etched;
    forming a CMP sacrificial layer on the storage node layer, the CMP sacrificial layer filling a space surrounded by the storage node layer;
    polishing the CMP sacrificial layer and the storage node layer, which are formed on the mold layer, using a chemical mechanical polish (CMP) process; and
    removing the CMP sacrificial layer disposed inside the storage nodes and the mold layer disposed outside the storage nodes.

5. The method of claim 1 wherein portions of the storage nodes in the contact holes define a cavity within the contact holes.

* * * * *